(12) United States Patent
Maekawa et al.

(10) Patent No.: US 9,121,094 B2
(45) Date of Patent: Sep. 1, 2015

(54) SPUTTERING METHOD AND SPUTTERING APPARATUS

(75) Inventors: Kaoru Maekawa, Albany, NY (US);
Hiroyuki Nagai, Nirasaki (JP); Tatsuo Hatano, Nirasaki (JP); Takashi Sakuma, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 2026 days.

(21) Appl. No.: 12/072,089

(22) Filed: Feb. 22, 2008

(65) Prior Publication Data

US 2008/0230375 A1    Sep. 25, 2008

(30) Foreign Application Priority Data

Feb. 26, 2007  (JP) .................. 2007-45836

(51) Int. Cl.
| | | |
|---|---|---|
| C23C 14/34 | (2006.01) | |
| C23C 14/18 | (2006.01) | |
| C23C 14/02 | (2006.01) | |
| C23C 14/54 | (2006.01) | |
| H01L 21/285 | (2006.01) | |
| H01L 21/768 | (2006.01) | |
| H01L 23/532 | (2006.01) | |

(52) U.S. Cl.
CPC ............. *C23C 14/185* (2013.01); *C23C 14/027* (2013.01); *C23C 14/345* (2013.01); *C23C 14/544* (2013.01); *H01L 21/2855* (2013.01); *H01L 21/76844* (2013.01); *H01L 21/76855* (2013.01); *H01L 21/76873* (2013.01); *H01L 21/76883* (2013.01); *H01L 23/53238* (2013.01); *H01L 2924/0002* (2013.01)

(58) Field of Classification Search
CPC .. C23C 14/185; C23C 14/027; C23C 14/345; C23C 14/544
USPC ............... 204/192.1, 192.12, 192.15, 298.13, 204/192.17; 257/751
See application file for complete search history.

(56) References Cited

U.S. PATENT DOCUMENTS

| | | | | |
|---|---|---|---|---|
| 5,122,250 A * | 6/1992 | Doormann et al. | ...... | 204/192.26 |
| 5,772,856 A * | 6/1998 | Kawase et al. | ............. | 204/192.2 |
| 6,331,484 B1 * | 12/2001 | Bhowmik et al. | ............. | 438/648 |
| 6,440,280 B1 * | 8/2002 | Burton et al. | ............ | 204/298.06 |
| 6,452,780 B2 * | 9/2002 | Kobayashi et al. | ........ | 361/308.1 |
| 6,709,553 B2 * | 3/2004 | Wang et al. | ................ | 204/192.3 |
| 7,304,384 B2 * | 12/2007 | Koike et al. | ................... | 257/751 |

(Continued)

FOREIGN PATENT DOCUMENTS

| | | |
|---|---|---|
| JP | 2005-277390 | 10/2005 |
| JP | 2006-148075 | 6/2006 |

(Continued)

*Primary Examiner* — John Brayton
(74) *Attorney, Agent, or Firm* — Pearne & Gordon LLP

(57) ABSTRACT

The objective of the present invention is to provide a technique capable of easily forming an alloy layer containing an additive metal on an object to provide a concentration gradient in a thickness direction by sputtering in one treatment vessel. That is, the present invention can form a film with the desired concentration, and includes a first film forming process and a second film forming process that changes at least one of, the pressure in the treatment vessel, and the electric power so they are different from the first film forming process, so that the concentration of the additive metal is different from the concentration of the additive metal of the first alloy film.

6 Claims, 20 Drawing Sheets

(56) References Cited

U.S. PATENT DOCUMENTS

2003/0192778 A1* 10/2003 Yamaguchi et al. ..... 204/192.12
2007/0002239 A1* 1/2007 Koike .......................... 349/139

FOREIGN PATENT DOCUMENTS

JP          2008-187072         8/2008
WO    PCT/JP2005/15699      *   3/2006

* cited by examiner

SPUTTERING METHOD AND SPUTTERING APPARATUS

TECHNICAL FIELD

The present invention relates to a sputtering method and a sputtering apparatus for depositing a main metal containing an additive metal on a treatment object.

BACKGROUND OF THE INVENTION

The multilayer wiring structure in a semiconductor device is formed by burying a metal wiring in an interlayer insulating film. A Cu (copper) is used as a material for this metal wiring because of low electromigration and low resistance, and a damascene process is commonly utilized as a forming process.

In this damascene process, a trench for burying a wiring, which is to be arranged inside a layer, on an interlayer insulating film in a substrate, and a via hole for burying a connection wiring, which connects upper and lower wirings, are formed, and a Cu is buried on these depressed portions by a CVD or an electrolytic plating method. And, in order to favorably perform the burying of the Cu, it is necessary to form a very thin Cu seed layer along the inner face of the depressed portion on the surface of the interlayer insulating film in a case when the CVD method is used, and it is also necessary to form a Cu seed layer, which becomes an electrode, on the depressed portion in a case when utilizing the electrolytic plating method is used. Further, because the Cu is easy to diffuse in the insulating film, it is necessary to form, for example, a barrier film, which consists of a laminated body of Ta/TaN, on the depressed portion. Therefore, the barrier film and the Cu seed layer are formed on the surface of the depressed portion by, for example, a sputtering method.

By the way, the miniaturization of a wiring pattern has been progressing. As a result, it is necessary for the barrier film and the seed layer to be a further thin layer. However, in a case when forming the barrier film and the seed layer, the metal forming them is formed in a thick layer around the opening compared to the deep part of the depressed portion because the width of the depressed portion is miniaturized. For this reason, it is difficult to form the barrier film and the seed layer with a high uniformity in the depressed portion, thus the reliability against a barrier property, and the contactability of an interface with the seed layer is an issue.

Based on such background, the Japanese Published Unexamined Patent Application No. 2005-277390 (paragraph 0018 to 0020, FIG. 1 and so on) discloses a method for forming an alloy film of Cu and an additive metal, such as Mn (manganese), along the surface of a depressed portion of an insulating film, and subsequently forming a barrier film by annealing. More specifically, by the annealing, the Mn in the alloy moves so as to discharge from the Cu, so that a portion of Mn diffuses on the surface of the interlayer insulating film and reacts with the O, which is a constituent element of the interlayer insulating film. As a result, a self aligning barrier layer, such as an oxide $MnOx$ (x is a counting number) or $MnSixOy$ (x and y are counting numbers) that is an extremely stable compound, is formed. Along with this, an excess Mn, which was not utilized in the forming of the barrier layer, moves to the surface side of the alloy film (the opposite side of the interlayer insulating film), and the moved Mn is removed at a subsequent process. The self-aligning barrier film formed in this way will be extremely uniform and thin, thereby it contributes in resolving the issue described above.

By the way, in order to form the barrier film described above efficiently, it is preferable to configure the Mn concentration higher as the lower the layer of the alloy film, it enables the reaction of the Mn with the interlayer insulation film easier, and also when the Mn concentration is lower, the greater the layer of the alloy film, which makes it easy to diffuse and deposit the residual Mn on the surface of the alloy film by the concentration gradient of the Mn in the film. By forming the alloy film in a way that the concentration gradient is formed, the residue of the Mn on the seed layer can be suppressed, and as a result, an increase in the wiring resistance can also be suppressed. Further, since the Mn can be diffused in a low temperature, the heat history until the wiring to be formed can also be suppressed thereby the damage to the wiring can be suppressed.

In order to provide the concentration gradient of the Mn as described above, forming the alloy film by a chemical method, such as the CVD (Chemical Vapor Deposition), to change the amount of gas, which contains a deposition component supplied to the depressed portion, with time can be considered. However, because when forming a film by such a method, the control width of the gas is small because an organic liquid source is vaporized, thus a large concentration gradient can not be provided.

Therefore, for example, forming the alloy film with the concentration gradient of the Mn as described above by a physical method, such as sputtering like a PVD (physical vapor deposition), can be considered. However, in such a case, it is necessary to use Cu alloys with different Mn concentrations as a metal target, which requires treatment vessels for the number of that targets for storing the target to process a substrate. As a result, the size of the film forming apparatus increases and the substrate is needed to be transferred between the treatment vessels, which results in a decrease in throughput.

Also, other than the case where forming the self-aligning barrier film as described above, a wiring metal may be formed on a substrate so as to include an additive metal to suppress the electromigration. For example, in a case when forming a wiring with Al (aluminum), film is formed such that a few atomic percent of a Cu is contained in the Al, and the Cu atom enters the gap formed between the Al atoms, thereby preventing the Al moving and the electromigration is suppressed. Further, in a case when forming a wiring with a Cu, an atom, such as Ag (silver), or Sn (tin), as an impurity.

For example, in a case when forming a wiring contains an additive metal to suppress the electromigration in such way after forming the barrier film and the seed layer on the depressed portion as described above, the additive metal being in a high concentration near a position closer to the barrier film in the seed layer is advantageous for increasing the electromigration resistance.

Also, in a case when forming one layer of an alloy film on each substrate by performing the film forming treatment using a sputtering film forming apparatus, it is necessary to change the metal target in a treatment vessel of the apparatus when attempting to change the concentration of the additive metal contained in the alloy film according to the type of the substrate.

For this reason, it is bothersome work to replace the metal target by opening the vacuum container, which is required, and also, the vacuuming after the replacement work takes long time.

SUMMARY OF THE INVENTION

The present invention has been made considering such situations, and the objective is to provide a technique capable of easily forming an alloy layer containing an additive metal on a processing object to provide a concentration gradient in a thickness direction by sputtering in one treatment vessel. Another objective of the present invention is to provide a technique capable of easily controlling the concentration of the additive metal in the alloy layer when forming the alloy layer on the processing object by sputtering.

The sputtering method for forming a film according to the present invention is characterized by including a process for transferring a processing object in a treatment vessel, which is provided with a metal target consisting of an alloy containing an additive metal and a main metal, a first film forming process for supplying a gas to generate a plasma in the treatment vessel, and supplying an electric power to this gas for plasmanizing, thereby forming a first alloy film on the processing object by the particles of the metal target sputtered with the plasma, and a second film forming process for generating a plasma by changing at least one of a pressure in the treatment vessel, and/or an electric power different from the first film forming process, thereby laminating a second alloy film, in which the concentration of an additive metal is different from the concentration of the additive metal of the first alloy film, by the particles of the metal target sputtered with the plasma.

The first film forming process and the second film forming process is performed, for example, by applying a bias voltage to draw an ion in the plasma into the metal target, and in the second film forming process, at least one item selected from: the pressure, the electric power, and the bias voltage is changed from the first film forming process. The bias voltage may be a negative direct current voltage in a range of approximately 1 kW to 20 kW. The electric power may be an electric power in a range of approximately 0.1 kW to 6 kW supplied from a high-frequency power source. The pressure value inside the treatment vessel may be in a range of approximately 0.133 Pa to $1.33 \times 10^3$ Pa. The main metal may be a copper, and the additive metal may be a manganese.

Another sputtering method for forming a film according to the present invention is to supply a gas for generating a plasma in a treatment vessel, which is provided with a metal target consisting of an alloy containing an additive metal and a main metal, and supplying an electric power to this gas for plasmanizing, thereby forming an alloy film on a processing object by the particles of the metal target sputtered with the plasma, and the method including:

a process for relating each parameter, including the pressure in the treatment vessel and the electric power, to treatment types, and readout the parameter value corresponding to the selected treatment type from a database using the database having at least one item selected from: the pressure in the treatment vessel and the electric power that is different between the treatment types;

a process for transferring the processing object into the treatment vessel; and a process for forming the alloy film to the processing object by generating a plasma according to the value of the read parameter, wherein the concentrations of the additive metals in the alloy films to be formed are different between the types of process.

The process for forming the alloy film is performed, for example by applying a bias voltage to draw the ion contained in the plasma into the metal target, and in the database, at least one item selected from: the pressure, the electric power, and the bias voltage, is different between the process types.

In the method described above, the bias voltage is, for example, a negative direct current power in a range of 1 kW to 20 kW, and the electric power is, for example, an electric power supplied from the high-frequency power source in a range of 0.1 kW to 6 kW. Also, for example, the pressure value inside the treatment vessel is in a range of 0.133 Pa to $1.33 \times 10^3$ Pa, the main metal is copper, and the additive metal is a manganese.

The sputtering apparatus for forming a film according to the present invention is to supply a gas for generating a plasma in a treatment vessel, which is provided with a metal target consisting of an alloy containing an additive metal and a main metal, and supplying an electric power to this gas for plasmanizing, thereby forming an alloy film on a processing object by the particles of the metal target sputtered with the plasma, and the sputtering apparatus includes:

a memory for storing a database, which relates a first alloy film to the value of each parameter, including the pressure in the treatment vessel and the electric power, and relates a second alloy film having the concentration of the additive metal different from those of the first alloy film to the value of each parameter, including the pressure in the treatment vessel and the electric power, and at least one item selected from: the pressure in the treatment vessel and the electric power, is different between the first alloy film and the second alloy film; and a control unit for displaying the value of a parameter from the database according to the first alloy film and the second alloy film, and outputting a control signal for forming the first alloy film and the second alloy film in this order according to the read parameter value.

On the metal target, connected is a power source for applying a bias voltage to draw the ion contained in the plasma, and in the database, at least one of the pressure, the electric power, and the bias voltage may be different between the first alloy film and the second alloy film. The bias voltage may be a negative direct current power in a range of approximately 1 kW to 20 kW. The electric power may be an electric power supplied from the high-frequency power source in a range of approximately 0.1 kW to 6 kW.

Another sputtering apparatus for forming a film according to the present invention is to supply a gas for generating a plasma in a treatment vessel, which is provided with a metal target consisting of an alloy containing an additive metal and a main metal, and supplying an electric power to this gas for plasmanizing, thereby forming an alloy film on a processing object by the particles of the metal target sputtered with the plasma, and the sputtering apparatus includes:

a memory for storing a database, which relates the value of each parameter, including the pressure in the treatment vessel and the electric power, to treatment types, and at least one item selected from: the pressure in the treatment vessel and the electric power, is different between the treatment types;

a means for selecting the treatment types; and a control unit readouts the parameter value according to the treatment type selected by this means from the database, and outputting a control signal to execute the sputtering according to the read parameter;

wherein the concentrations of the additive metals in the alloy films to be formed are different between the treatment types.

With respect to the sputtering apparatus, onto the metal target, connected is a power source for applying a bias voltage to draw an ion contained in the plasma, and in the database, at least one of the pressure, the electric power, and the bias voltage may be different between the types of process. The pressure value inside the treatment vessel may be in a range of approximately 0.133 Pa to $1.33 \times 10^3$ Pa. The main metal may be a copper and the additive metal may be a manganese.

According to the present invention, the concentration of the additive metal in the alloy film on the processing object is changed by changing a parameter, such as the pressure in the treatment vessel, the electric power of the high-frequency for generating a plasma, or the electric power supplied to the metal target for drawing the plasma. Therefore, the films with different concentration of the additive metals, in other words, an alloy film with a concentration gradient of the additive metal in a thickness direction, may be formed in a shared treatment vessel. As a result, because it is not necessary to provide a plurality of treatment vessels for sputtering deposition, the size of the apparatus can be minimized, and the time to transfer between the treatment vessels can be saved, thereby the throughput can be improved. Further, since the database, in which the additive metal concentration intended to the alloy film is related to the parameter values, is prepared in advance, and the process is performed according to the parameter values read from the database, the additive metal concentration can easily be controlled, thereby the alloy film with a desired additive metal concentration can easily be obtained.

DETAILED DESCRIPTION OF THE INVENTION

Figure 1:
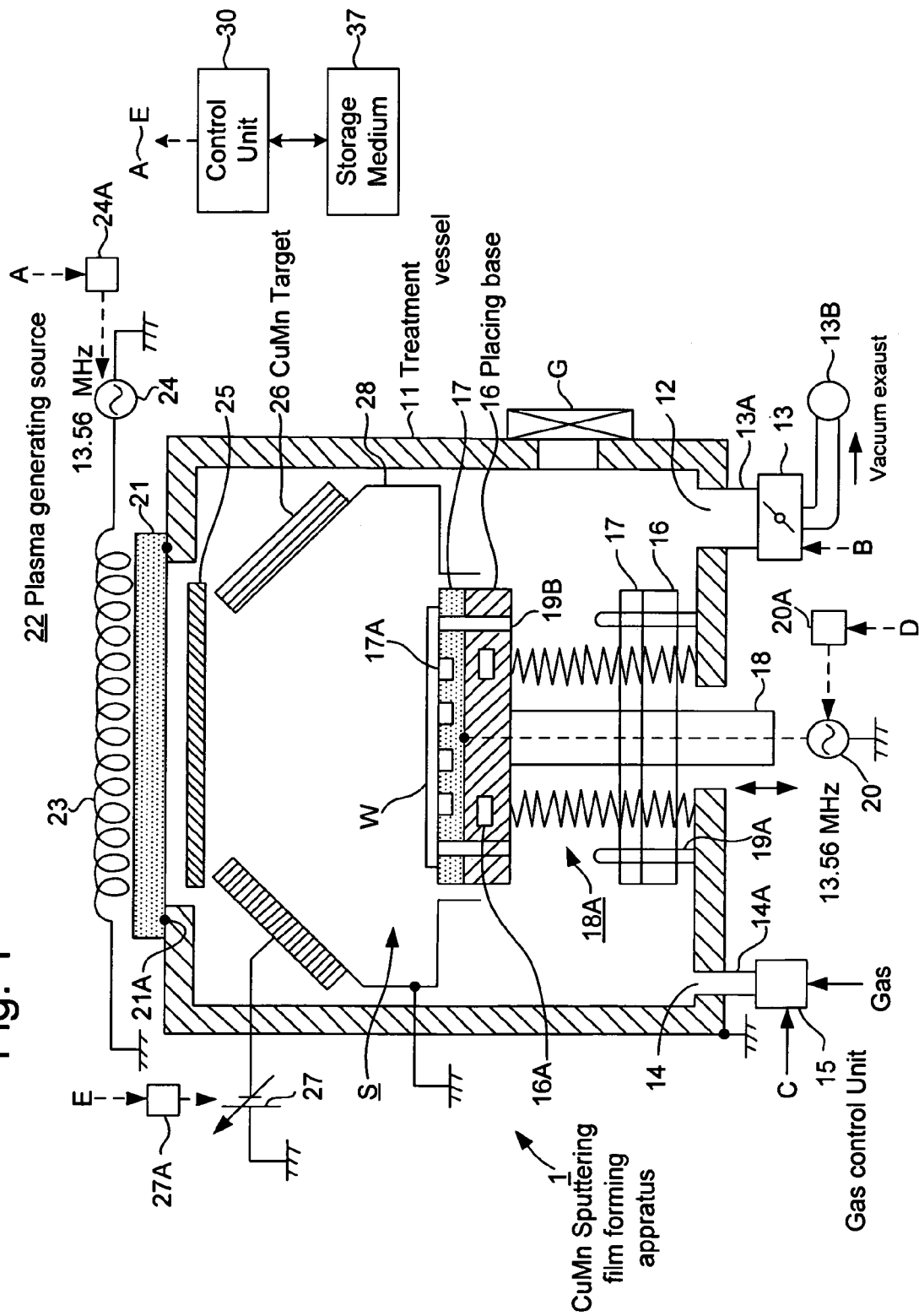
FIG. 1 is a longitudinal section side view of a sputtering apparatus according to the present invention.

An embodiment, in which applying the sputtering film forming apparatus of the present invention to a CuMn sputtering film forming apparatus 1, is explained with reference to FIG. 1. This sputtering film forming apparatus 1 is called an ICP (Inductively Coupled Plasma) type plasma sputtering module, and has a treatment vessel 11, which formed in a cylindrical form with, for example, aluminum (Al) and so on. The treatment vessel 11 is grounded, and an exhaust outlet 12 is provided to the bottom. One end of an exhaust pipe 13A is connected to the exhaust outlet 12, and the other end of the exhaust pipe 13A is connected to a vacuum pump 13B through a throttle valve 13. With respect to the throttle valve 13, the degree of opening is adjusted according to a control signal transmitted from a control unit 30 described later and the treatment vessel 11 is evacuated, thereby a desired degree of vacuum is maintained. G in the figure is a gate valve to transfer a semiconductor wafer (hereinafter referred as a wafer). Further, on to the bottom of the treatment vessel 11, provided is, for example, a gas feed opening 14 as a gas feeding means to feed a predetermined gas into the treatment vessel 11. One end of the gas feed opening 14 is a gas feed pipe 14A, and the other end of the feed pipe 14A is connected to a gas control unit 15 consisting of, for example, a gas flow rate control unit and a valve. The gas control unit 15 controls the feeding of a plasma gas, such as an Ar gas, or another necessary gas, such as N$_2$ gas, to the treatment space S according to the control signal transmitted from the control unit 30.

In this treatment vessel 11, provided is a placing base 16 consisting of, for example, Aluminum, and on a top face of the placing base 16, provided is an electrostatic chuck 17 to absorb and retain the wafer W. 16A in the figure is a passage for a thermally conductive gas for improving the thermal conductivity of the wafer W and the placing base 16. Also, 17A in the figure is a circulating passage to circulate cooling medium for cooling the wafer W, and this cooling medium is fed though a channel (not shown) in a column 18, which supports the placing base 18. The column 18 is elevatably configured by an elevation mechanism (not shown), which enables the placing base 16 to move up and down. 18A in the figure is an expandable bellows surrounding the column 18, which tolerates the up-down movement of the placing base 16 while maintaining the airtightness of the treatment vessel 11. 19A in the figure is three supporting pins (two of which are shown in the figure). Further, 19B in the figure is a pin insertion hole corresponding to the supporting pin 19A, and the wafer W can be transferred between the supporting pin 19A and a wafer W transferring means (not shown) when declining the placing base 16. A high-frequency power source 20, which generates a high frequency of, for example 13.56 MHz, connected to the electrostatic chuck 17 described above, and a predetermined bias can be applied to the placing base 16. 20A in the figure is a controller to control the electric power of the high-frequency power source.

On the ceiling of the treatment vessel 11, provided is a permeable plate 21 which consists of a dielectric body, such as aluminum nitride, and has permeability against the high-frequency, though a sealing member 21A, such as an O-ring. 22 in the figure is a plasma generating source for generating plasma by plasmanizing, for example, an Ar gas supplied to the treatment space S in the treatment vessel 11. More specifically, this plasma generating source 22 is provided with an induction coil 23 corresponding to the permeable plate 21, and a high-frequency power source 24 of, for example, 13.56 MHz, for generating plasma by applying a high-frequency voltage to this induction coil 23, thereby a high-frequency, which is an energy for generating plasma, can be introduced to the treatment space S through the permeable plate 21 from the induction coil 23. With respect to the electric power value of the high-frequency power source 24, a controller 24A receives a control signal from control unit 30 described later, and the electric power value is controlled through this controller 24A.

Right below the permeable plate 21, provided is a shield plate 25 consisting of, for example, an Aluminum for diffusing the high-frequency, and on the lower portion of this shield plate 25, provided is a CuMn target 26, which is formed, for example, in a loop form by inclining the cross section inward so as to surround the upper side of the treatment space S. This target 26 consists of a Cu alloy containing Cu as a main metal and Mn as an additive metal, and the Mn content is, for example, 1 atomic % to 10 atomic %. A variable direct current power source 27 is connected to the CuMn target 26, which enables the application of a negative direct current voltage as a bias voltage for drawing the ion contained in the plasma into the CuMn target 26. A controller 27A is connected to the variable direct current power source 27, and the controller 27A receives a control signal transmitted from the control unit 30 just as the controllers 24A and 20A connected to each high-frequency power source 24 and 20, thereby controlling the electric power value supplied to the CuMn in the variable direct current power source 27. Further, on the lower portion of the CuMn target 26, provided is a protection cover 28, which is grounded and formed in a cylindrical form consisting of, for example, an Aluminum, so as to surround the treatment space S. And the lower portion of this cover 28 is bent inward and placed adjacent to the side portion of the placing base 16.

Figure 2:
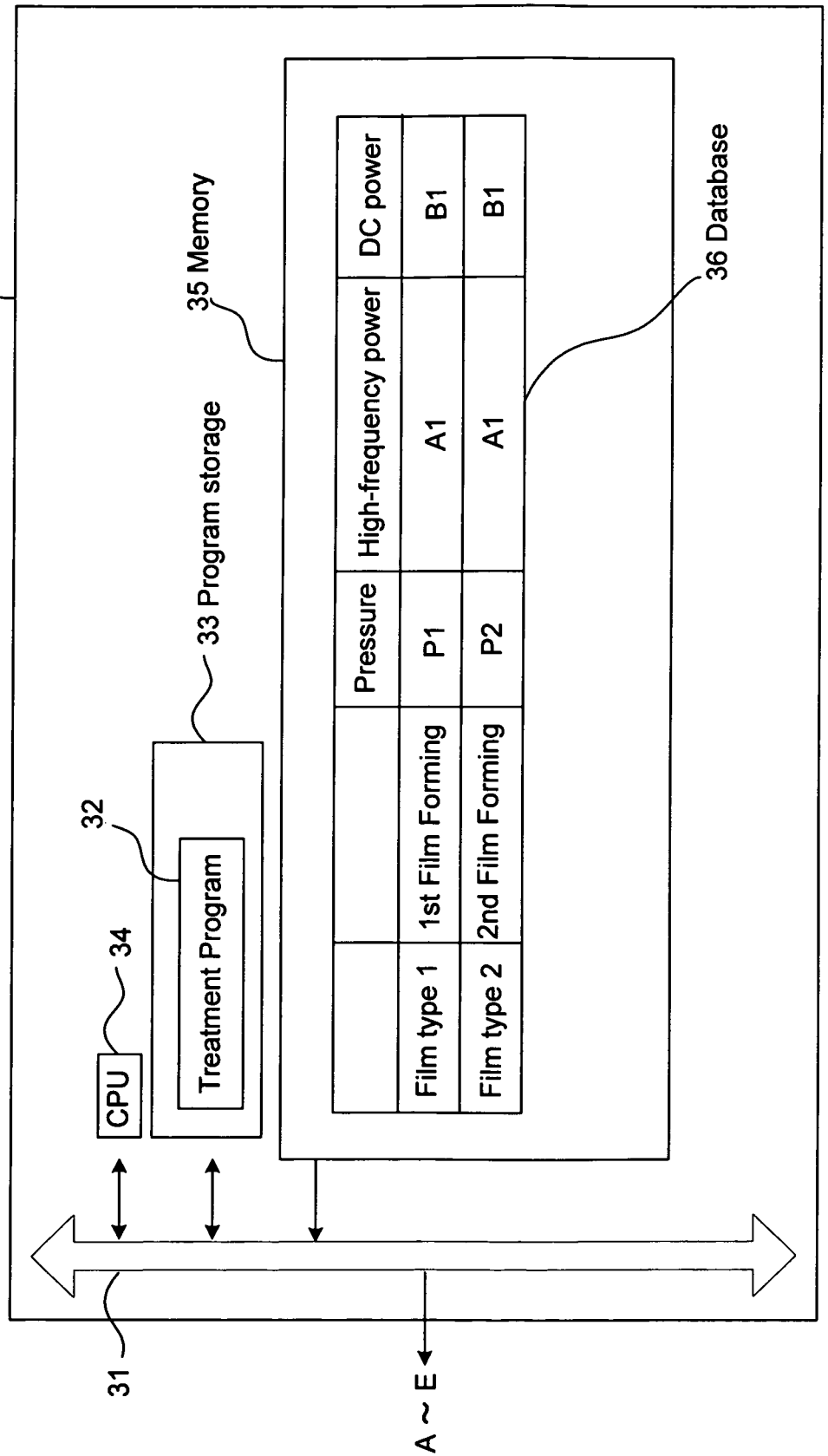
FIG. 2 is a configuration diagram of a control unit of a sputtering apparatus according to the present invention.

Next, a control unit 30 provided to the CuMn sputtering film forming apparatus is explained with reference to FIG. 2. The control unit 30 consists of, for example, a computer, and is provided with an input screen for inputting and setting a recipe of the film forming. 31 in the figure is a bus. Communicating with the bus 31, are a program storage 33 to store a treatment program 32, a CPU 34, and a memory 35, which is provided with a database 36. The database 36 shown in FIG. 2 is conceptually illustrates a portion of a treatment recipe that establishes a procedure to determine the overall process. And for each of a first film forming process for forming a CuMn film with a high Mn concentration, and a second film forming process for a CuMn film with a low Mn concentration, the pressure value inside the treatment vessel 11, which is a portion of a treatment parameter, and each parameter for the electric power value of the high-frequency power source 24 and the electric power value of the variable direct current power source 27 is related and created. In this example, the pressures are different in the first film forming process and the second film forming process (P1<P2).

This treatment program 32 and the database 36 are stored in a storage medium 37 consisting of, for example, a flexible disc, a compact disc, or a MO (magneto-optic disc), and installed in the control unit 30 as shown in FIG. 1.

Figure 3:
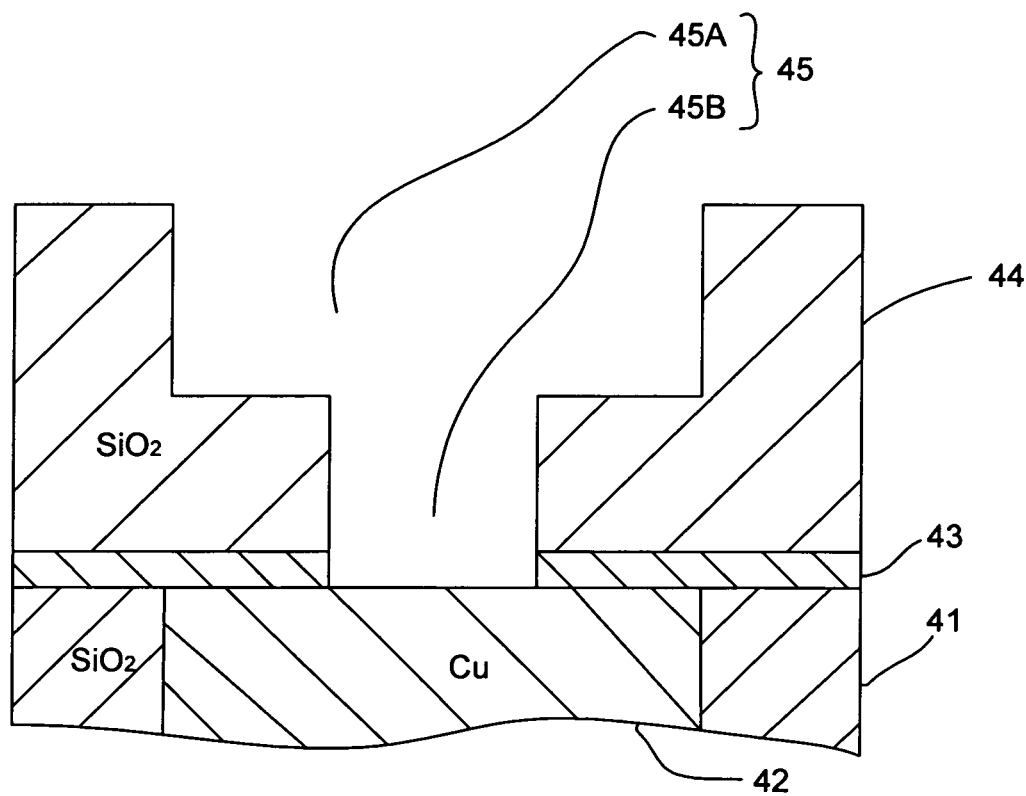
FIG. 3 is a process diagram showing a formation of a film by a sputtering apparatus according to the present invention.

Next, explained is a wafer W, which is treated by the CuMn sputtering film forming apparatus 1. On the surface of the wafer W before transfer to the sputtering film forming apparatus 1, a Cu is buried in an interlayer insulating film 41 consisting of a $SiO_2$ (silicon oxide) as shown in FIG. 3 to form a lower wiring 42, and on the interlayer insulating film 41, an interlayer insulating film 44 is laminated through a barrier film 43. And, in the interlayer insulating film 44, a depression 45, which consists of a trench 45A and a via hole 45B, is formed, and the lower wiring 42 is exposed inside the depression 45. The process described hereinafter is also used to bury a Cu in this depression 45, and to form an upper wiring, which is electrically connected to the lower wiring 42. In addition, the $SiO_2$ film is named as an example of the interlayer insulating film, however, it may be a SiOCH film.

Figure 4:
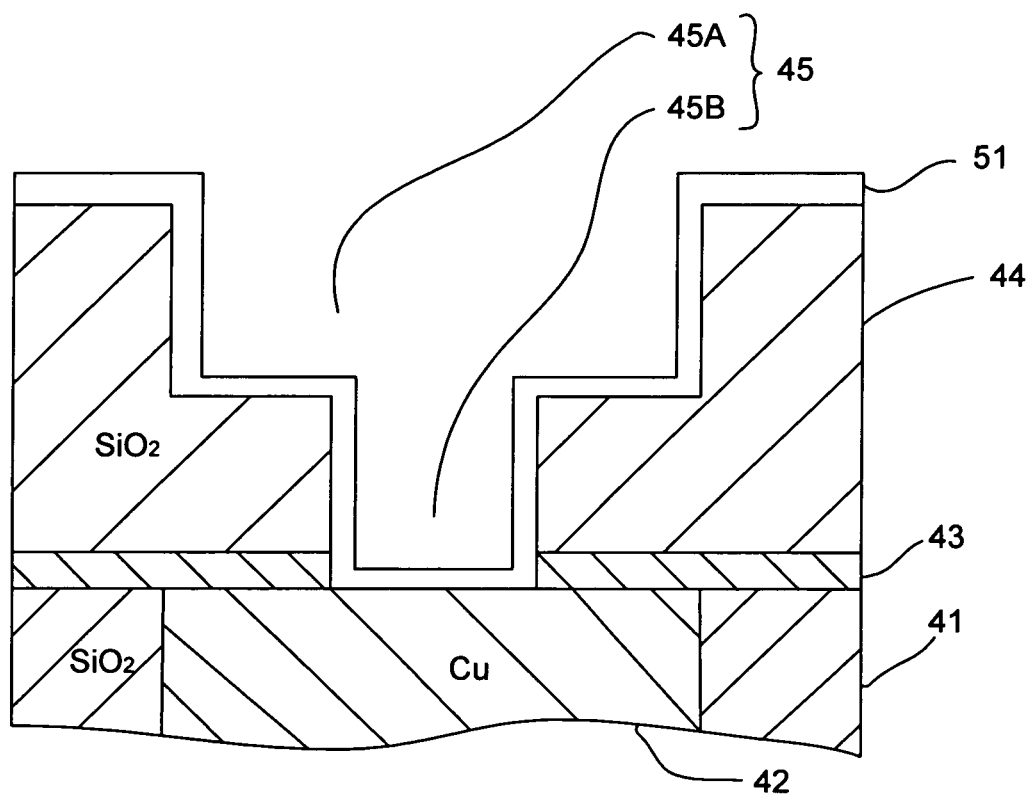
FIG. 4 is a process diagram showing a formation of a film by a sputtering apparatus according to the present invention.
Figure 5:
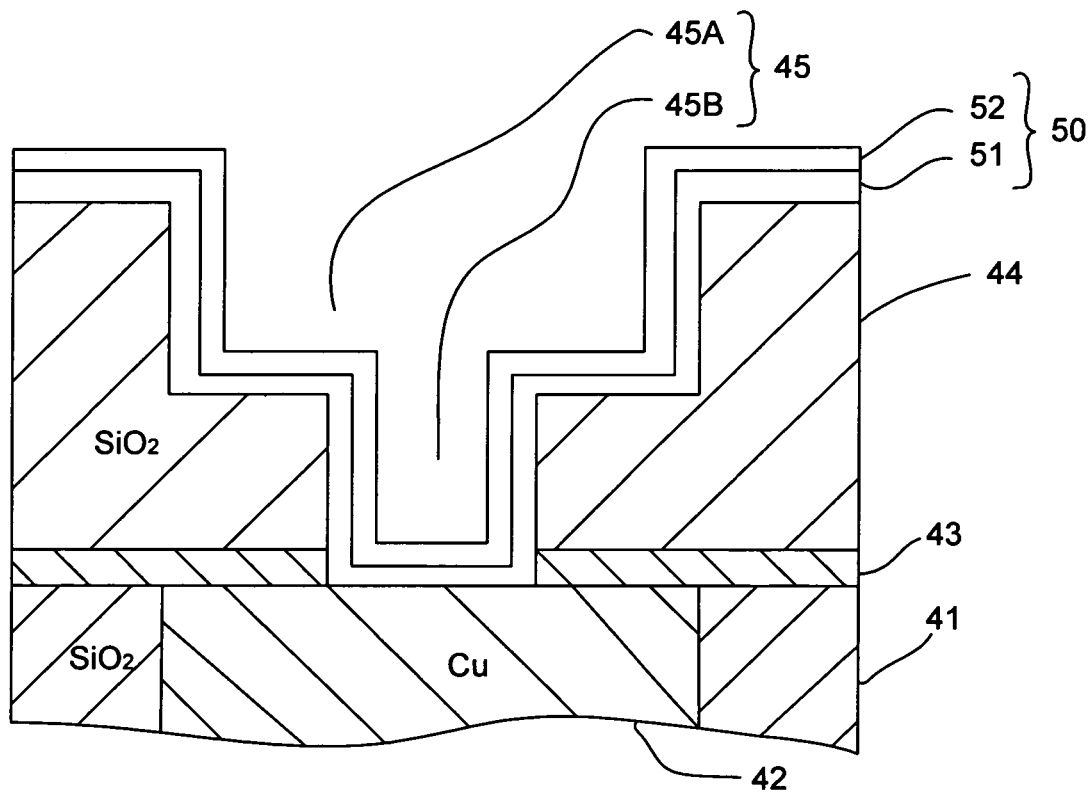
FIG. 5 is a process diagram showing a formation of a film by a sputtering apparatus according to the present invention.

A process for forming the CuMn film 50, which is a laminated film having a different Mn concentration in the upper layer and the lower layer, is hereinafter explained with reference to FIGS. 3, 4, and 5. First, the gate valve G opens, a transfer mechanism (not shown) sends the wafer W into the treatment vessel 11, and the wafer W is transferred to the supporting pin 19A. Thereafter, the gate valve G closes, the placing base 16 elevates to transfer the wafer W onto the electrostatic chuck 17, the elevation of the placing base 16 stops when the wafer W is elevated to a predetermined position, the degree of opening of the throttle valve 13 is adjusted, and the vacuum pump 13B vacuums inside the treatment vessel 11. And, an Ar gas is supplied inside the treatment vessel 11 by the gas control unit 15, and the inside of the treatment vessel 11 is maintained to a pressure corresponding to the first film forming process of approximately 0.133 Pa to 2.66 Pa (1 to 20 mTorr). Thereafter, a direct current power of approximately 10 W to 1 kW, which is a bias power to draw an ion contained in a plasma by the variable direct power source 27, is supplied to the CuMn target 26, and further a high-frequency power of approximately 1 to 5 kW is supplied to the induction coil 23 through the high-frequency power source 24, as well as, for example, approximately 500 W of bias power is supplied to the placing base 16.

By the electric power supplied to the induction coil 23, the Ar gas is plasmanized and forms an Ar plasma in the treatment space S, and then an Ar ion in the Ar plasma collide to the CuMn target 26, thereby this CuMn target 26 is sputtered. The Cu atom (a Cu atom group) and the Mn atom (a Mn atom group) in the sputtered CuMn target 26 are ionized when passing thorough the plasma. The ionized Cu atom and Mn atom are attracted to the placing base 16 by the applied bias, accumulate on to the wafer W on the placing base 16, and the lower layer film 51 (film type 1) of CuMn, which is an alloy film of Cu and Mn, is formed as shown in FIG. 4, and the lower layer film 51 covers inside the depressed portion 45. The film thickness of this lower layer film 51 is, for example, 1 nm to 50 nm, and the Mn content is approximately 5 atomic % to 10 atomic %.

When the first film forming process is completed after, for example, a predetermined time from when the high-frequency power is supplied to the induction coil 23, the degree of opening of the throttle valve 13 changes. And, the pressure in the treatment vessel 11 is maintained to the pressure of approximately 6.65 to 13.5 Pa (50 to 100 mTorr), which corresponds to, for example, the film type 2, the upper layer film 52 (film type 2) is laminated on the lower layer film 51 as shown in FIG. 5, thereby the CuMn film 50 is formed. The film thickness of this upper layer film 52 is, for example, 1 nm to 50 nm, the Mn content is approximately 1 atomic % and 5 atomic %, and the film with the high Mn concentration and the film with the lower Mn concentration are laminated in this order. In this way, as it is apparent from the experimental example described later, the Mn concentration in the formed film changes by changing the pressure. The reason for this is thought that the distribution and the electron density of the plasma formed in the treatment vessel 11 change, thereby the ionization rate for Cu or Mn changes.

When the CuMn film 50 is formed in this way, the supply of the DC power to the CuMn target 26, and the supply of the high-frequency power, as well as the Ar gas, to the induction coil 23 and the placing base 16 are stopped. Thereafter, the placing base 16 declines, the gate valve G opens, the wafer W is transferred to a transferring means (not shown), and the treated wafer W is sent out from the treatment vessel 11.

According to the embodiment described above, the lower layer film 51 and the upper layer film 52 with different Mn concentrations can be obtained by changing the pressure of the treatment space S in the treatment vessel 11. As a result, the films with different Mn concentration against the Cu in the thickness direction can be formed. Thus, there is no need for a plurality of treatment vessels 11 contain the CuMn targets 26, each having a different composition, thereby the size of the apparatus can be minimized. Also, the time to transfer the wafer W between each treatment vessel 11 can be saved, thereby the decrease in the throughput can be suppressed.

Figure 6:
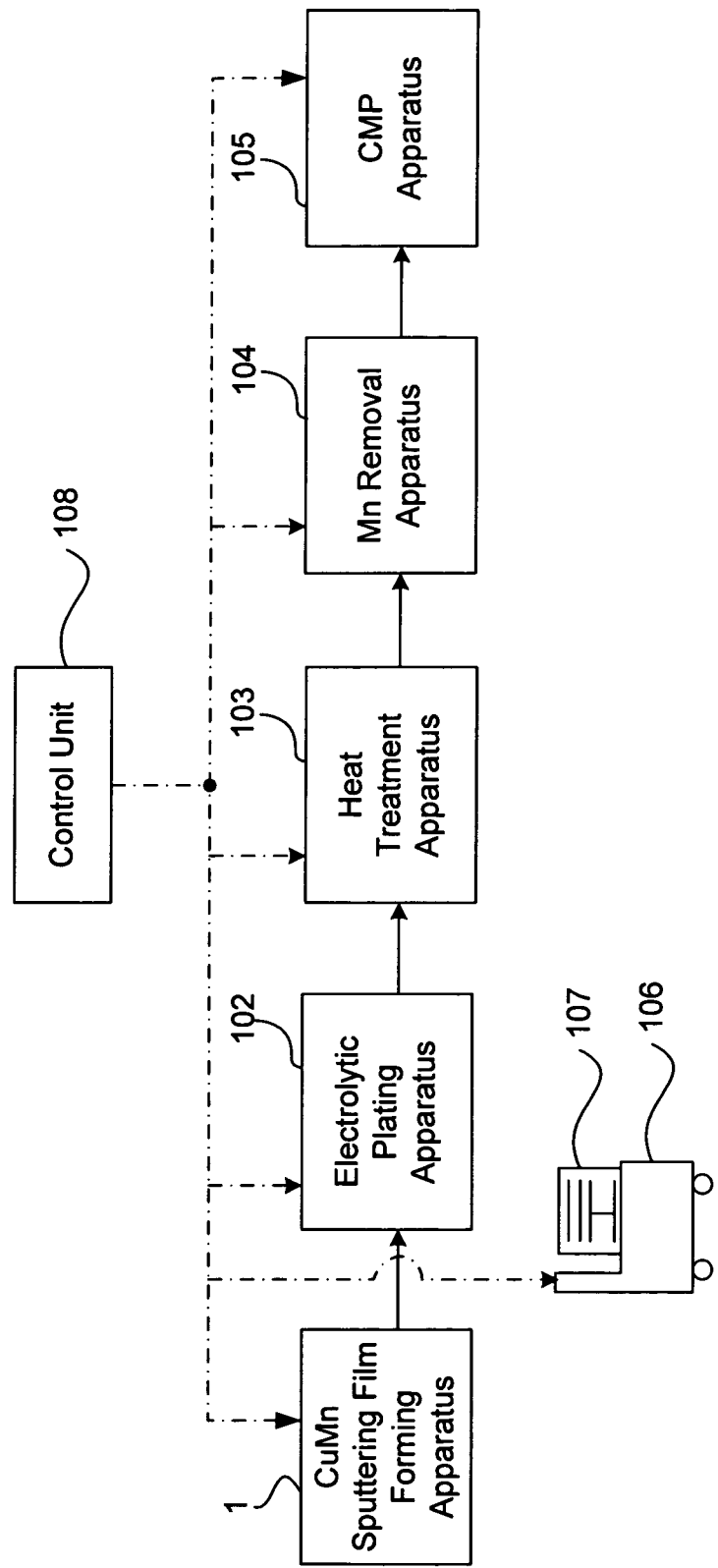
FIG. 6 is a configuration diagram of a substrate treatment system including a sputtering apparatus.
Figure 7:
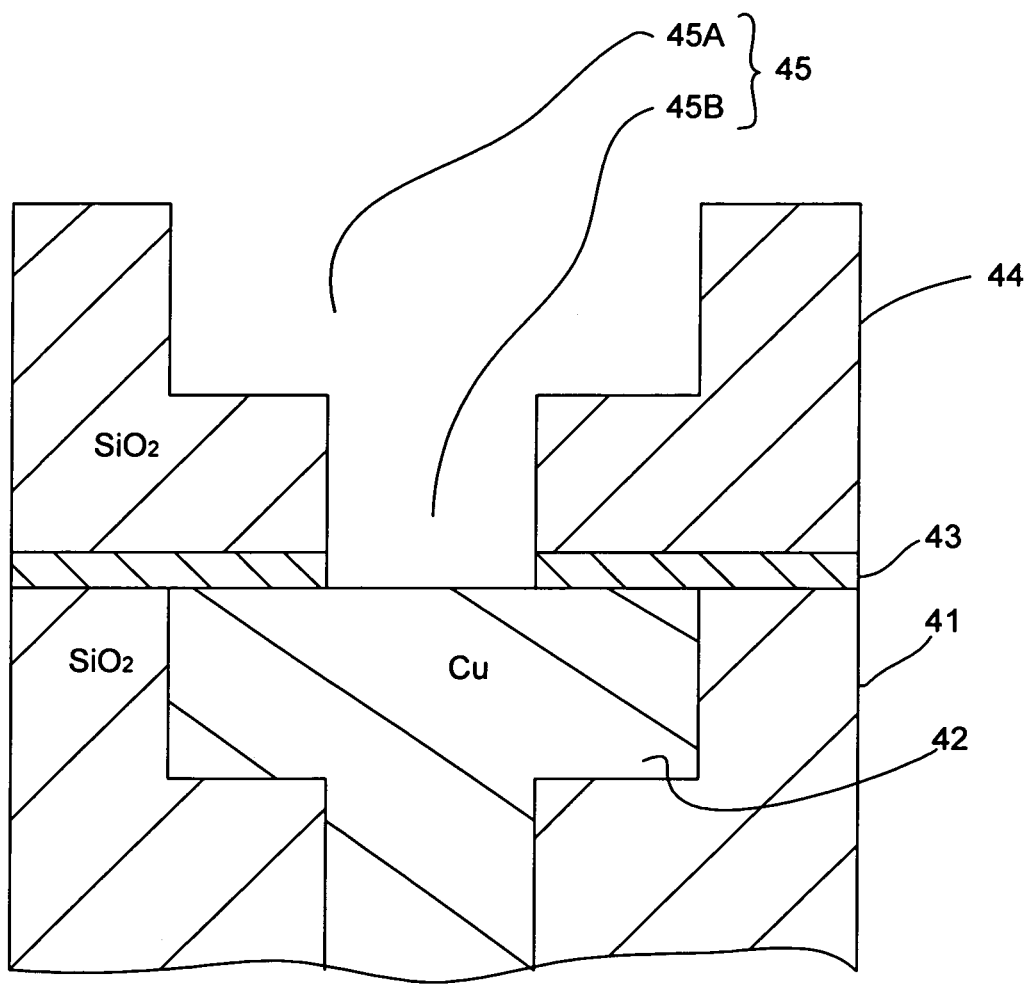
FIG. 7 is a process diagram showing a formation of a wiring by the substrate treatment system.
Figure 8:
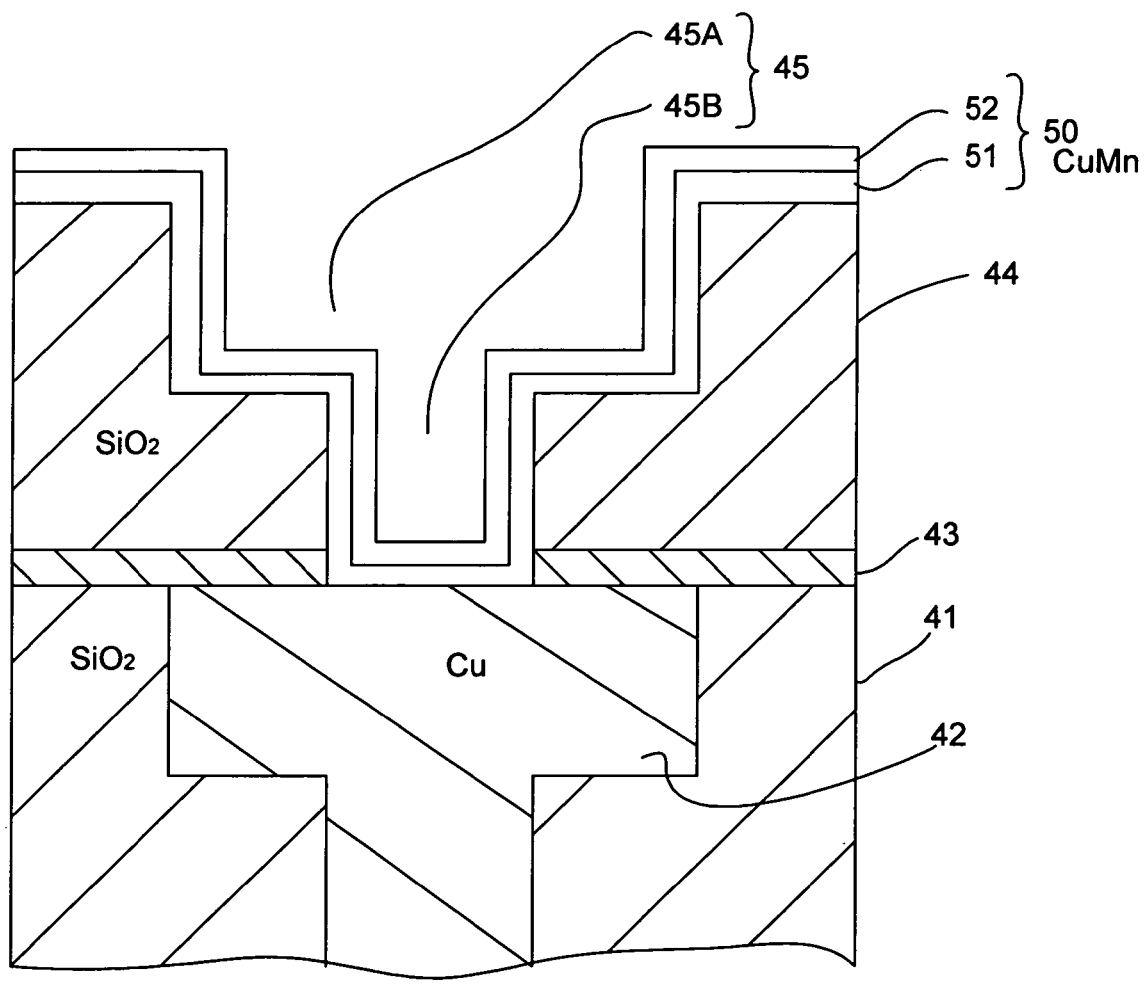
FIG. 8 is a process diagram showing a formation of a wiring by the substrate treatment system.

Next, explained is a substrate treatment system 101, in which the CuMn sputtering film forming apparatus 1 is applied, for forming a wiring on the surface of the wafer W with reference to FIG. 6. 102 in the figure is an electrolytic plating apparatus to deposit Cu, which consists of the wiring, on the wafer W. 103 in the figure is a heat treatment apparatus to heat to a predetermined temperature while supplying a $N_2$ (nitride) gas on the wafer W. Also, 104 in the figure is a Mn removal apparatus for performing a wet cleansing where dipping the wafer in a solution that dissolves Mn, such as hydrochloric acid to remove the Mn on the surface. 105 in the figure is a CMP (Chemical Mechanical Polishing) Apparatus.

106 in FIG. 6 is an automated transfer robot for transferring a carrier 107, which includes a plurality of wafers W, for example 25 wafers, in a clean room. As shown with an arrow of solid line in FIG. 6, the carrier 107 is transferred in the order of the CuMn sputtering film forming apparatus 1=>the electrolytic plating apparatus 102=>the thermal treatment apparatus 103=>the Mn removal apparatus 104=>the CMP apparatus 105.

Further, a control unit 108 for controlling each apparatus 102 to 105 and the automated transfer robot 106 includes the control unit 30 of the CuMn sputtering film forming apparatus 1 and a host computer to control the operation of each apparatus 1, 102 to 105 and the automated transfer robot 106 so as to form a wiring on the wafer W as described later.

Further, explained is a process for manufacturing a semiconductor by the substrate treatment system 101 with reference to FIGS. 7 to 12. FIGS. 7 to 12 are cross sectional diagrams of a manufacturing process of a semiconductor device formed on the surface of the wafer W. First, the carrier 107 is transferred to the CuMn sputtering film forming apparatus 1 by the automated transfer robot 106, and the CuMn film 50 is formed as described above (FIGS. 7 and 8).

Figure 9:
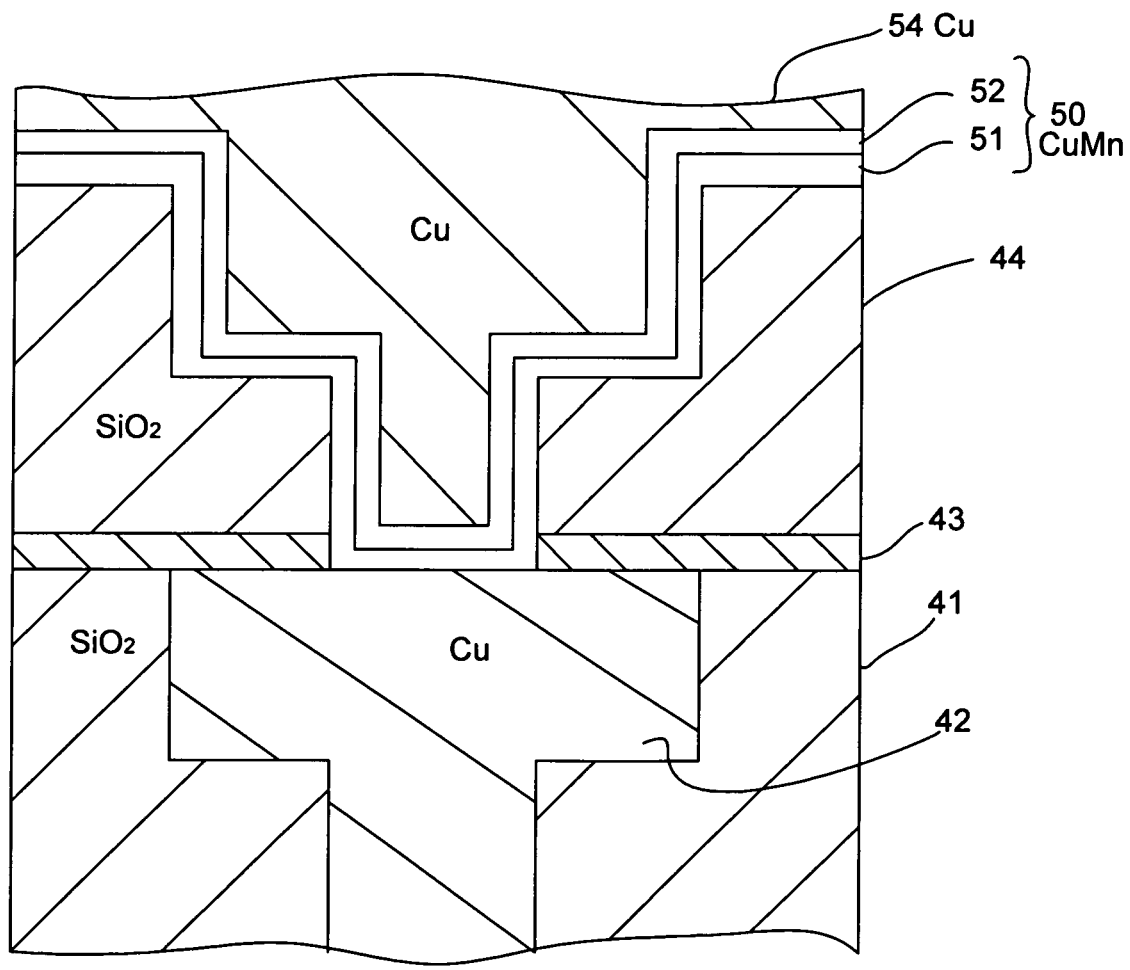
FIG. 9 is a process diagram showing a formation of a wiring by the substrate treatment system.
Figure 10:
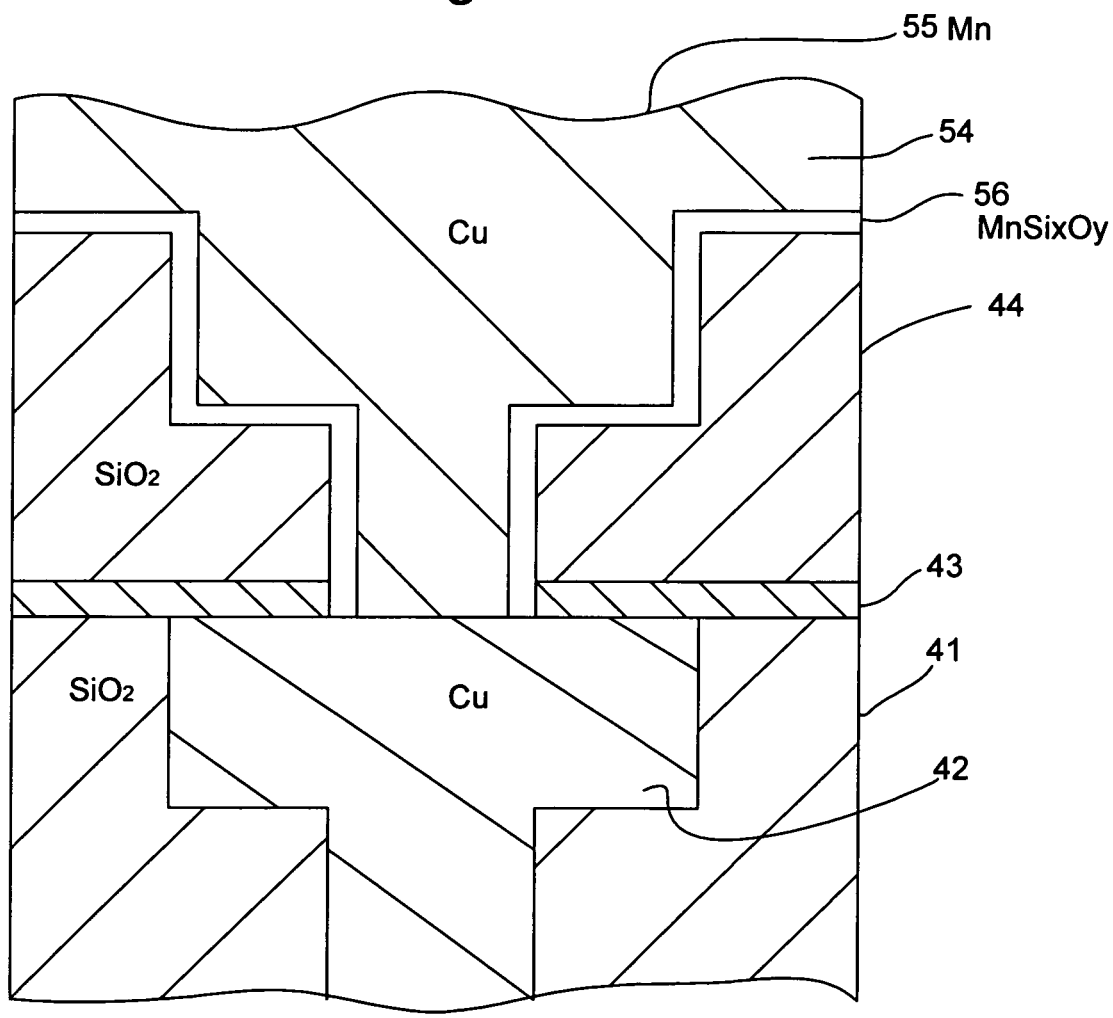
FIG. 10 is a process diagram showing a formation of a wiring by the substrate treatment system.
Figure 11:
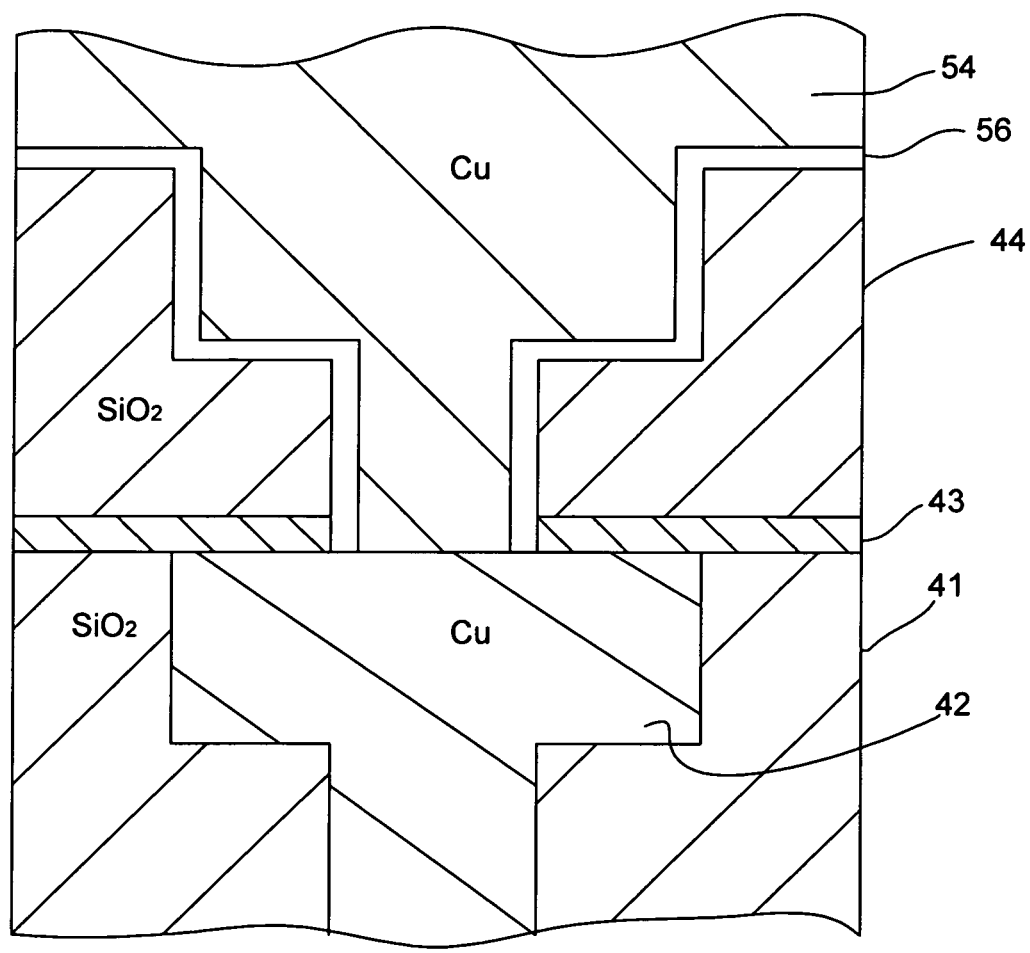
FIG. 11 is a process diagram showing a formation of a wiring by the substrate treatment system.

In the following explanation, a description is made such that "the wafer W is transferred between the apparatuses", in order to simplify the description. The wafer W with the CuMn film 50 formed is consequently transferred to the electrolytic plating apparatus 102, and a Cu 54 is buried on the Cu film 50 (FIG. 9). Next, the wafer W is transferred to the heat treatment apparatus 103, where it is heated while supplied with a $N_2$ gas. By this heat treatment, the separation of the Cu and the Mn in the CuMn film 50 progresses, a portion of the Mn moves to the surface side of the CuMn film 50, further passes though the Cu 54, and deposited on the surface, thereby forms, for example, the Mn film 55. Meanwhile, a portion of the Mn is diffused on the surface of the interlayer insulating film 44 and reacts with $SiO_2$, thereby forms a MnSixOy film 56. Further, the CuMn 50, in which the Mn separated, blends with the Cu 54 buried by the electrolytic plating, and then becomes a portion of the wiring metal (FIG. 10). The MnSixOy film 56 functions as a barrier layer to prevent the Cu 54 from diffusing into the $SiO_2$ film 44.

Figure 12:
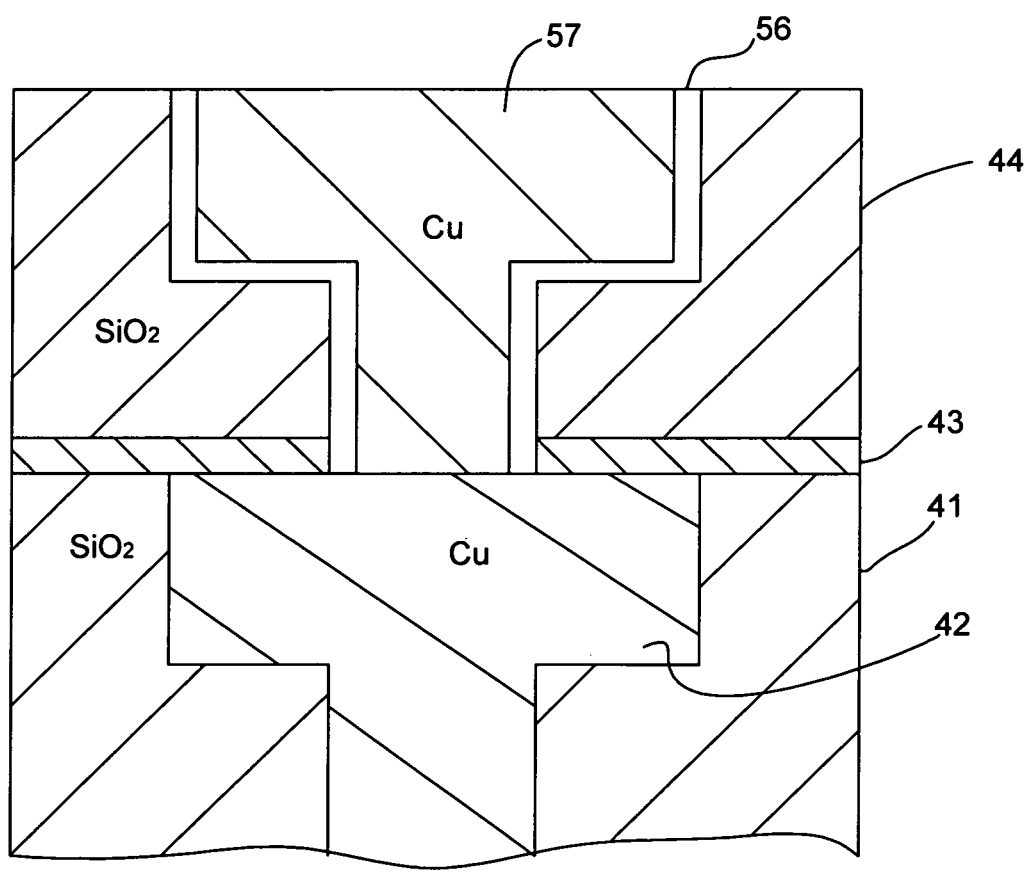
FIG. 12 is a process diagram showing a formation of a wiring by the substrate treatment system.

After the heat treatment, the wafer W is transferred to the Mn removal apparatus 104 to remove the Mn film 55 (FIG. 11), thereafter, the wafer W is transferred to the CMP apparatus 105 and applied the CMP treatment, thereby the wiring 57 is formed (FIG. 12). In a case when the Mn film 55 may be removed simultaneously with the CMP treatment, the removal of the Mn film by the Mn removal apparatus 104 may be omitted. Also, other than the procedure described above, the wafer W may be transferred in a following order: CuMn sputtering film forming apparatus 1=>heat treatment apparatus 103=>Mn removal apparatus 104=>electrolytic plating apparatus 102=>CMP apparatus 105. In this way, the Mn may be removed by depositing the Mn contained in the CuMn film onto the surface along with forming the MnSixOy film as a barrier layer by performing the heat treatment first. Thereafter, the wiring may be formed by burying the Cu by the electrolytic placing, where the Mn isolated from CuMn film, as a seed layer, and performing the CMP treatment.

Figure 13:
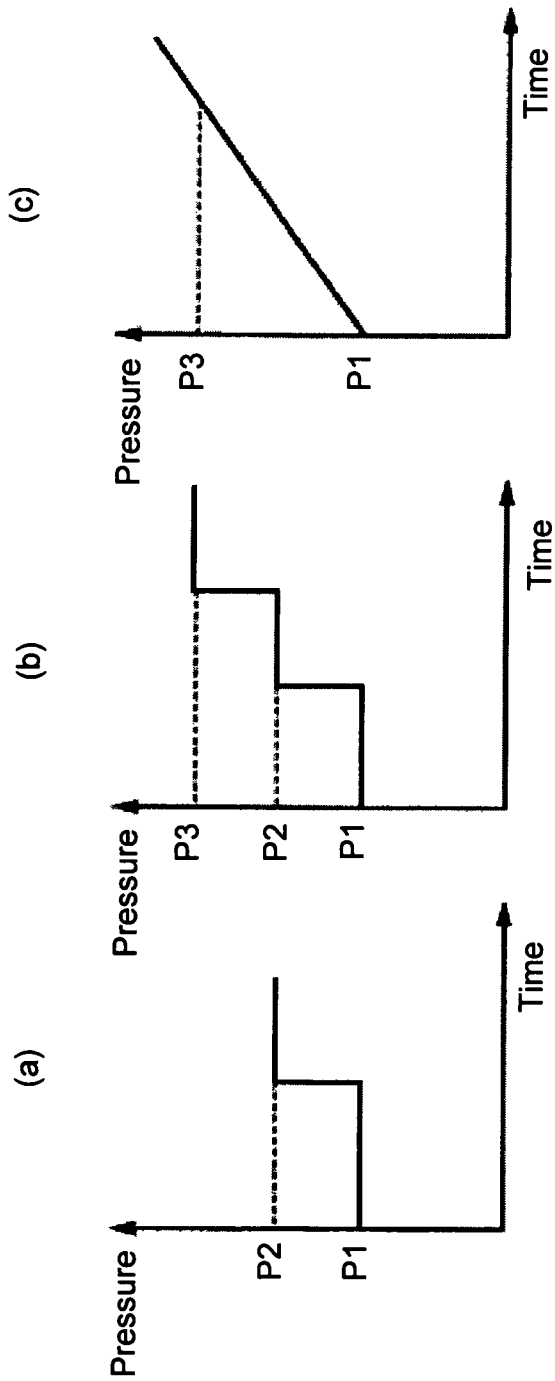
FIG. 13 is a graph showing an example of changing pressure to form a laminated film.

In addition, in the embodiment described above, the treatment is performed by switching the parameter of the pressure in the treatment vessel once after a lapse of predetermined time as shown in FIG. 13(a). However, the number of switching times is not limited to once, and it may be switched twice as shown in FIG. 13(b). Further, the treatment may be performed such that gradually changing parameter from a certain value to another value as shown in FIG. 13(c). In FIG. 13(a), for example, the process at the pressures P1 and P2 are corresponding to the first film forming process, and the process at the pressure P3 is corresponding to the second film forming process. Further, each process before and after changing the pressure from P1 to P3 corresponds to the first film forming process and the second film forming process respectively.

Although the case where the parameter of the pressure being changed, has been explained above, a different type of film can be formed on the wafer W, for example, by changing each parameter for the electric power value of the high-frequency power source 24 and the electric power value of the variable direct current power source 27 to perform the treatment as the pattern shown in the FIG. 13(a) to (c), instead of the pressure. In the CuMn sputtering film forming apparatus 1 described above, the concentration of the Mn contained in the CuMn film decreases as indicated in the evaluation exam described later when the electric power value of the high-frequency power source 24 is increased, and the Mn concentration increases when the electric power value of the variable direct current power source 27 is increased. As with the case of the pressure, it is thought that the distribution of the plasma formed in the treatment vessel 11 and the electron density change when the process condition is changed, thereby the ratio of the ionization of the Cu or Mn changes. When forming a laminated layer with different Mn concentrations as described above, forming of a film may be performed by changing one of the electric power values of the high-frequency power source 24 and the variable direct current power source 27, or forming of a film may be made by changing two or more of these parameters.

Also, the above embodiment explains the case when forming a self-aligning barrier film, however, the sputtering method using the sputtering apparatus described above may be applied in a case when forming a wiring capable of suppressing the electro-migration and the stress migration. For example, instead of providing the CuMn target 26 in the sputtering film forming device 1, a CuAg sputtering device provided with a CuAg target, which contains a Ag in Cu as an additive metal, may be utilized. In such a case, performing the Cu burying process described above and a process condition may be changed during the process as in the embodiment described above, such that first performing the sputtering with the process condition that the Ag concentration in the Cu to be relatively high and consequently performing the sputtering with the process condition that the Ag concentration in the Cu to be relatively low. By performing the sputtering in this way, the increase of the wiring resistance can be minimized while improving the resistance to the electro-migration.

In order to suppress the electro-migration and the stress migration, other than Ag, for example, Si, Al, Ti, Sn, Ni, Mg, Co, Cr, Mo, Ru, V, and Nb may be utilized as an additive metal added to the Cu. Further, for example, a Cu may be added as a metal to suppress the electro-migration and the stress migration in a case when a wiring is configured with, for example, Aluminum.

Figure 14:
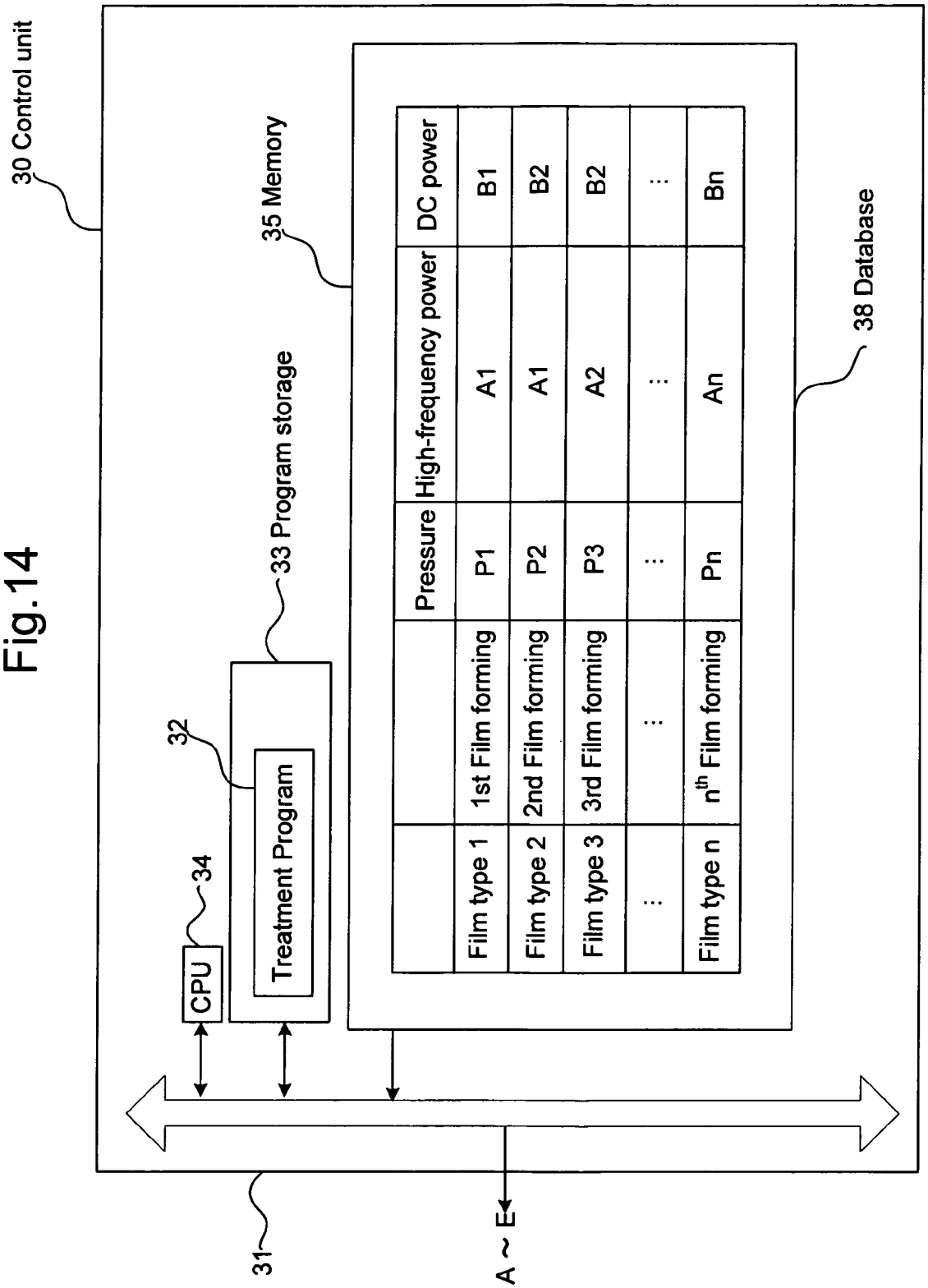
FIG. 14 is a configuration diagram of another control portion of a sputtering device.

With respect to the CuMn sputtering film forming apparatus 1, not only when forming a laminated layer, but it can also be applied when forming a single layer film. In such a case, a database 35 as shown in FIG. 14 is stored in a memory 35 of the control unit 30. In this database 38, the type of film to be formed and each parameter value of the pressure, high-frequency electric power, and DC electric power are related in advance, and each parameter value is decided such that the concentrations of the additive metal are different between each type, namely, the concentration of the additive metal in the film in each type is determined to be a target value. In this example, the concentration of the additive metal is controlled by the combination of the three parameter values, however, the pressure may only be changed. In this example, an operator selects one film type from the film type 1 to film type n stored in the database 38, parameter of pressure and each electric power value corresponding to the film type are read out, and the film is formed according to the parameter. In such a case, the metal target in the treatment vessel 11 is not necessarily changed to the target with different metal concentrations, thus an alloy film with desirable additive metal concentrations can easily be formed.

(Evaluation Exam 1)

First, a sample 1-1 is prepared as follows: by the CuMn sputtering film forming apparatus 1 provided with the CuMn target 26 contains Mn of 2 atomic % described above, perform the treatment according to the procedure of the embodiment described above by configuring pressure in the treatment vessel 11 to 12 Pa (90 mTorr) to form a CuMn film in a film thickness of 50 nm on one wafer W of 300 mm in diameter consisting of $SiO_2$. Consequently, a sample 1-2 is prepared by forming a film with the same treatment condition as the sample 1-1, except that the pressure inside the treatment vessel 11 is set to 0.67 Pa (5 mTorr). Mn and Cu concentration in the direction of film thickness are measured for these samples 1-1 and 1-2 with a Secondary Ion Mass Spectrometer (SIMS).

Figure 15:
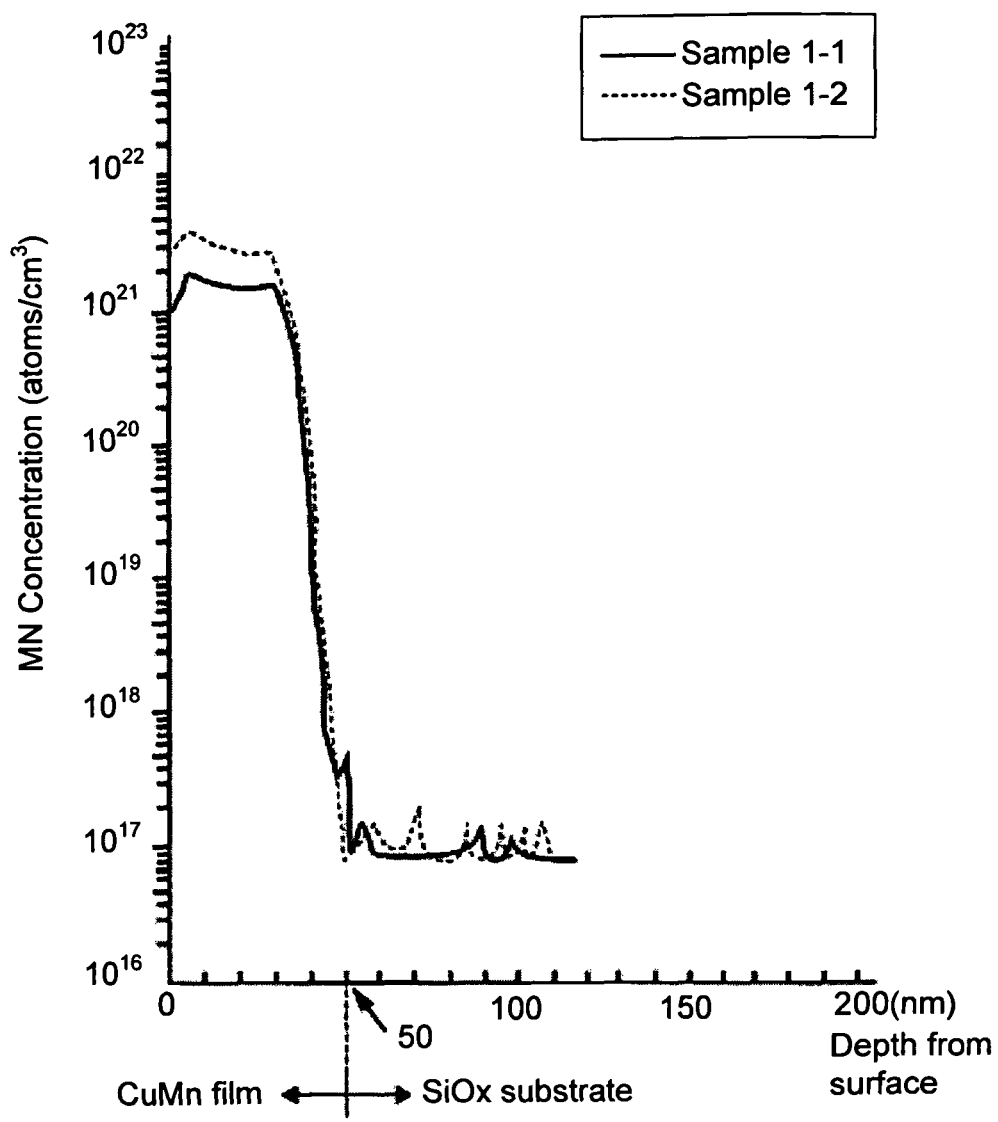
FIG. 15 is a graph showing a measurement result of Mn concentration in a depth direction of each sample by SMS.
Figure 16:
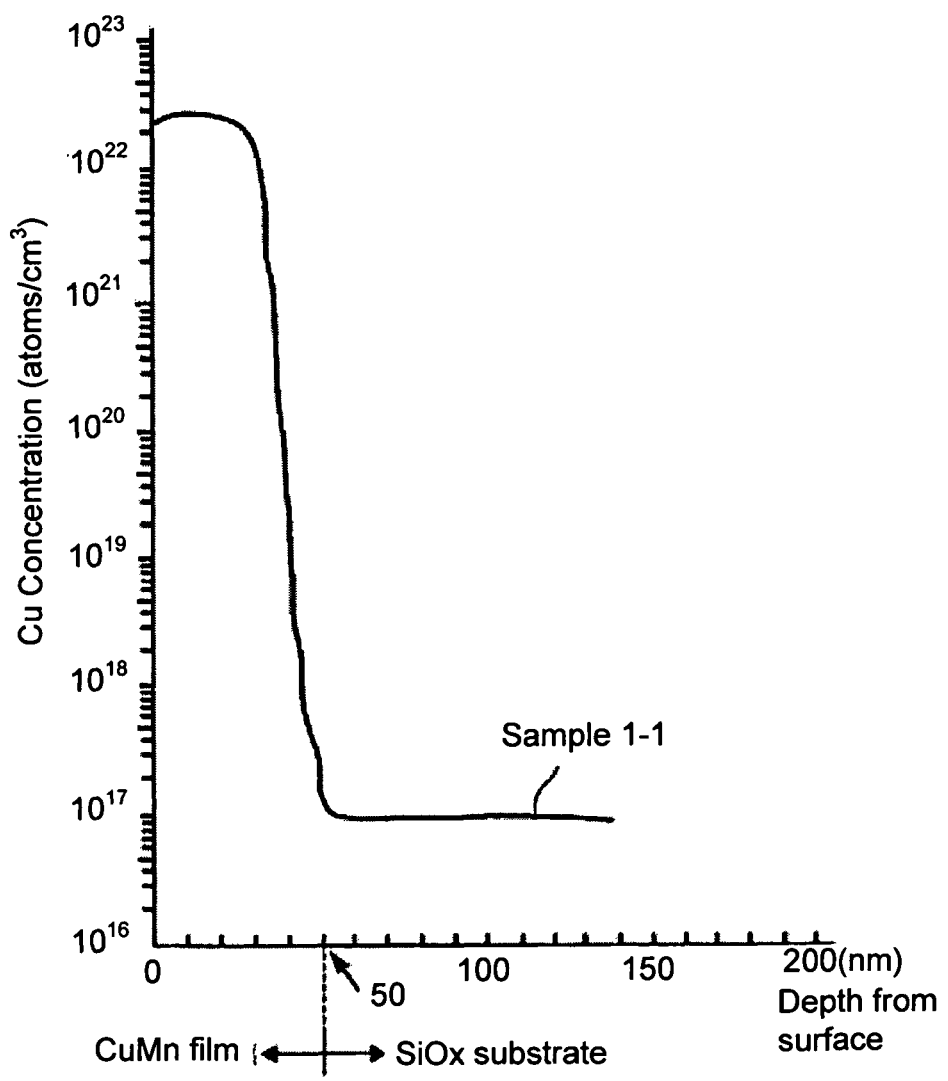
FIG. 16 is a graph showing a measurement result of Cu concentration in a depth direction of each sample by SIMS.

FIG. 15 is a graph showing measurement results on the Mn concentration. The result of the sample 1-1 is shown in a solid line, and the result of the sample 1-2 is shown in a dotted line. The vertical axis of the graph indicates the Mn concentration, and the horizontal axis of the graph indicates the depth from the surface of CuMn film. In this graph, the sample 1-2 showed approximately twice the Mn concentration of the sample 1-1 in the range of depth 0 to 50 nm wherein CuMn film exists. Further, FIG. 16 is a graph on the Cu. The samples 1-1 and 1-2 showed a similar result, thus only the measurement result of the sample 1-1 is shown in the graph to avoid complicating. From this result, it can be noted that the CuMn film with a different Mn concentration can be obtained because the Mn concentration increases when the pressure decreases.

(Evaluation Exam 2-1)

Next, in order to examine the effects of the pressure inside the treatment vessel, the electric power of the high-frequency power source and the electric power of the variable direct current power source, the CuMn films formed by changing these parameters are evaluated. Specifically, first, a sample 2-1 is prepared as follows: with the CuMn sputtering film forming apparatus 1 provided with a CuMn target 26 containing Mn of 6 atomic % described above, perform the treatment according to the procedure of the embodiment described above by configuring the pressure in the treatment vessel 11 to $1.33\times10^3$ Pa ($1.0\times10^4$ mTorr), the electric power of the variable direct current power source 27 to 10 kW, the electric power of the high-frequency power source 24 for generating a plasma to 6 kW to form a CuMn film in a film thickness of 50 nm on one wafer W of 300 mm in diameter consisting of $SiO_2$. Next, a sample 2-2 is prepared by forming a CuMn film with the same treatment condition as the sample 2-1, except for setting the pressure inside the treatment vessel 11 to 0.133 Pa (1.0 mTorr). And, a sample 2-3 is prepared by forming a CuMn film with the same treatment condition as the sample 2-1, except for setting the electric power of the high-frequency power source 24 to 0.1 kW (100 W). Further, a sample 2-4 is prepared by forming a CuMn film with the same treatment condition as the sample 2-1, except for setting the power of the variable direct current power source 27 to 20 kW, and a sample 2-5 is prepared by forming a CuMn film with the same treatment condition as the sample 2-1, except for setting the power of the variable direct current power source to 1 kW. The table 1 below summarizes the treatment condition for each sample. And the resistances of the CuMn films for samples 2-1 to 2-5 are measured.

TABLE 1

| | Pressure in the treatment vessel (mTorr) | Electric power of Variable DC power source (kW) | Electric power of High-Frequency power source for generating plasma (kW) |
| --- | --- | --- | --- |
| Sample 2-1 | $1.0 \times 10^4$ | 10 | 6 |
| Sample 2-2 | 1.0 | 10 | 6 |
| Sample 2-3 | $1.0 \times 10^4$ | 10 | 0.1 |
| Sample 2-4 | $1.0 \times 10^4$ | 20 | 6 |
| Sample 2-5 | $1.0 \times 10^4$ | 1 | 6 |

Figure 17:
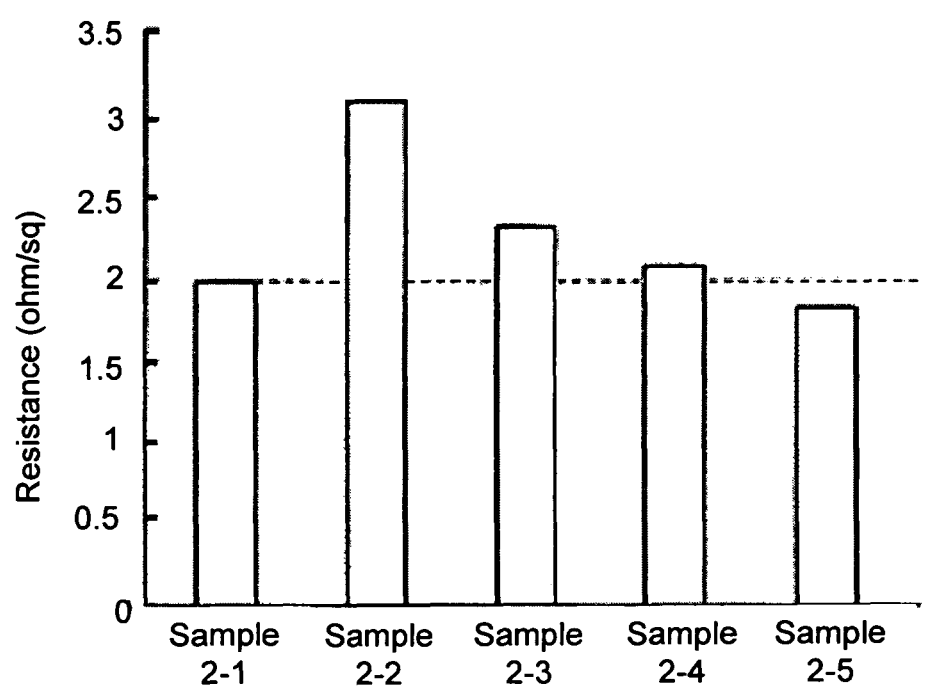
FIG. 17 is a graph showing a measurement result of resistance of CuMn film of each sample in an evaluation exam.

FIG. 17 is a graph showing the resistance of each sample, and the each CuMn film of samples 2-1 to 2-5 showed a different resistance. The resistance was high in the following order; sample2-2>sample2-3>sample2-2-4>sample2-1>sample2-5.

(Evaluation Exam 2-2)

Figure 18:
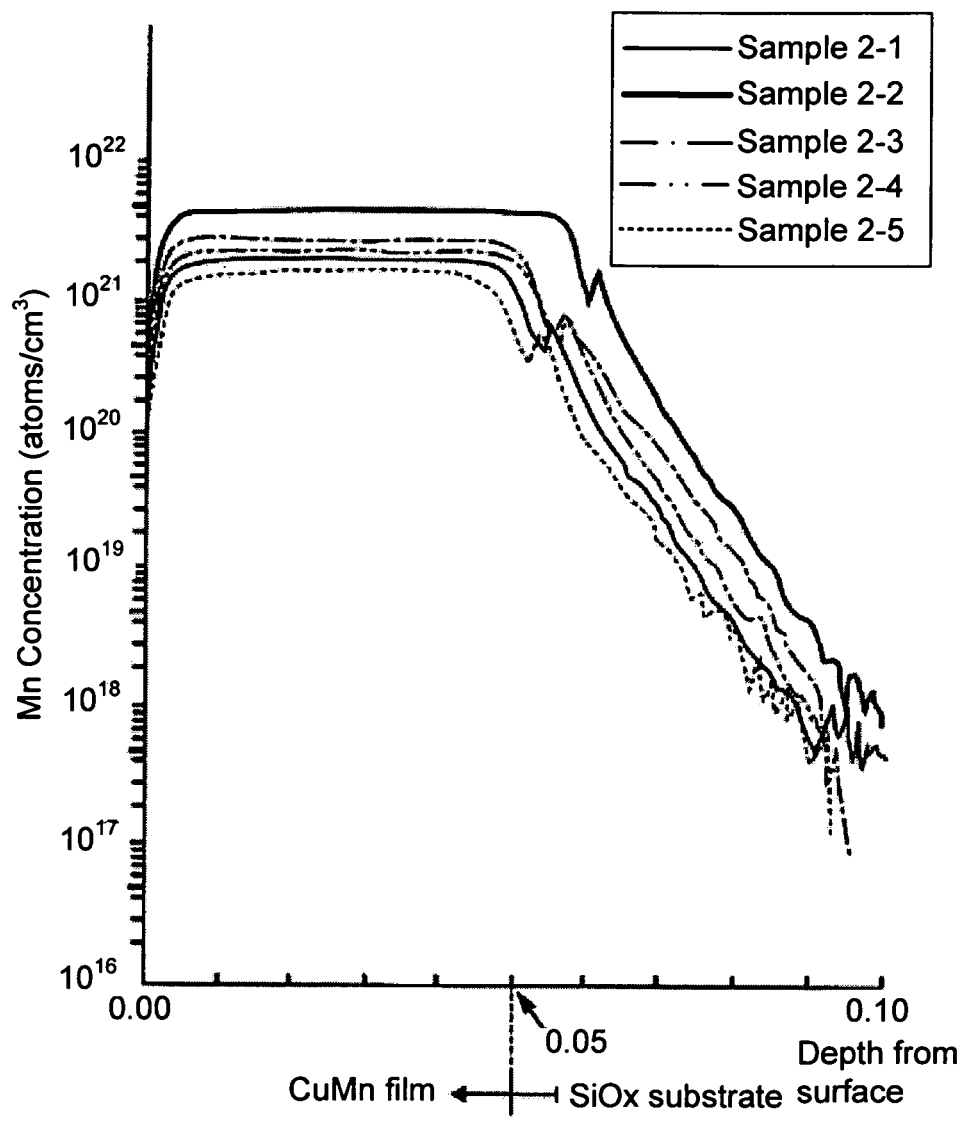
FIG. 18 is a graph showing a measurement result of Mn concentration in a depth direction of each sample by SIMS.

With respect to the samples 2-1 to 2-5 above, the concentrations of Mn, Cu, and O in the film thickness direction are measured by SIMS. FIG. 18 shows a measurement result of the Mn concentration by SIMS, and the vertical axis indicates the Mn concentration and the horizontal axis indicates the depth from the CuMn film surface. In the graph, the sample 2-1 is indicated in a thin solid line, the sample 2-2 in a thick solid line, the sample 2-3 in a dashed dotted line, the sample 2-4 in a dashed double-dotted line, and the sample 2-5 in a dotted line.

As shown in the graph, the Mn concentration in a range of the depth from the surface 0 to 0.05 μm where the CuMn film exists, are in the following order; sample 2-2>sample 2-3>sample 2-4>sample 2-1>sample 2-5. The resistance of the CuMn film is higher as the Mn concentration increases, thus the measurement result of the Mn concentration is consistent to the result of the resistance of the evaluation exam 2-1. Further, based on the results of the samples 2-1, 2-4 and 2-5, it can be understood that the Mn concentration in the film increases as the value of electric power of the variable direct current power source 27 increased. Also, based on the result of the samples 2-1 and 2-3, it can be understood that the Mn concentration increases when the value of the electrical power of the high-frequency power source 24 is decreased. Further, based on the results of the samples 2-1 and 2-2, it can be understood that when the pressure decreases, the Mn concentration increases.

Figure 19:
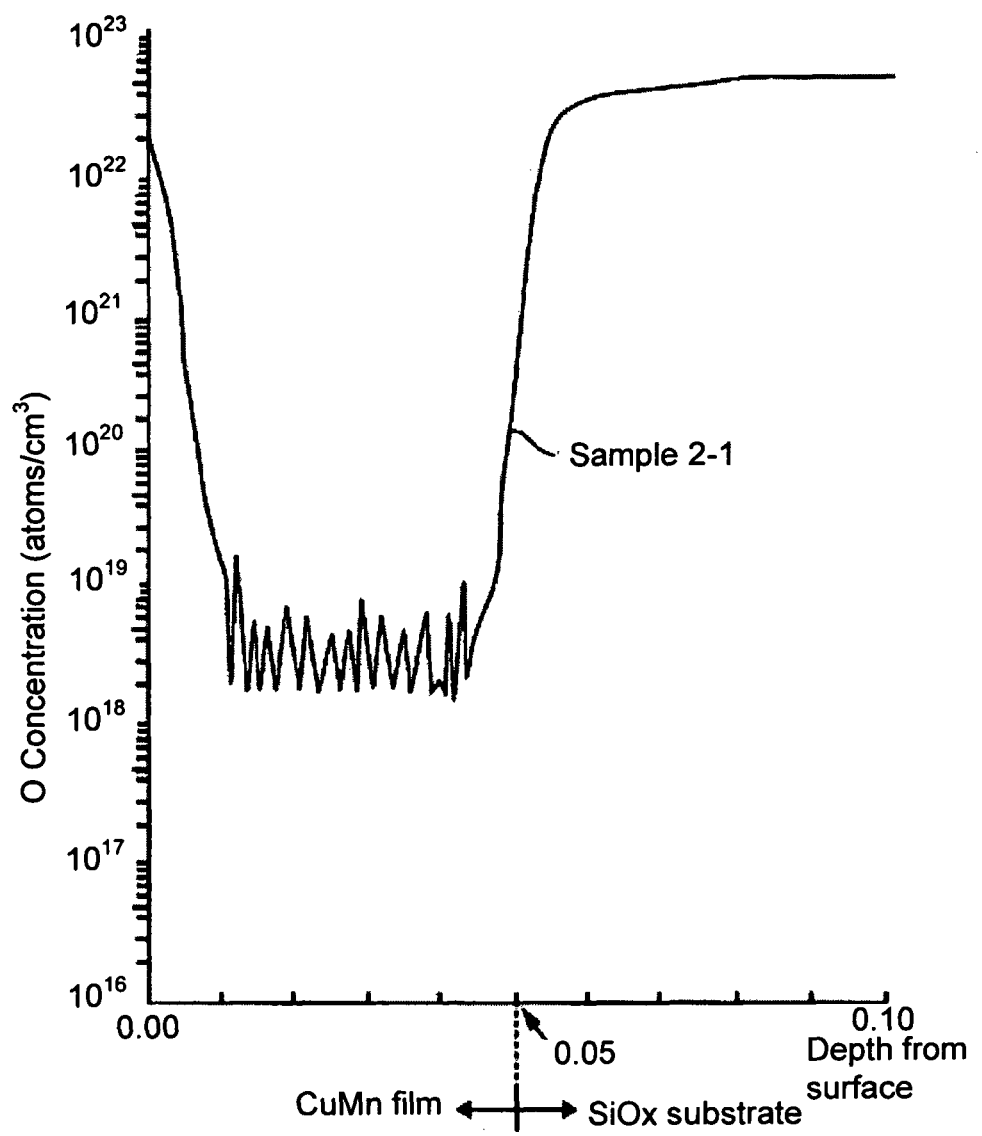
FIG. 19 is a graph showing a measurement result of O concentration in a depth direction of each sample by SIMS.
Figure 20:
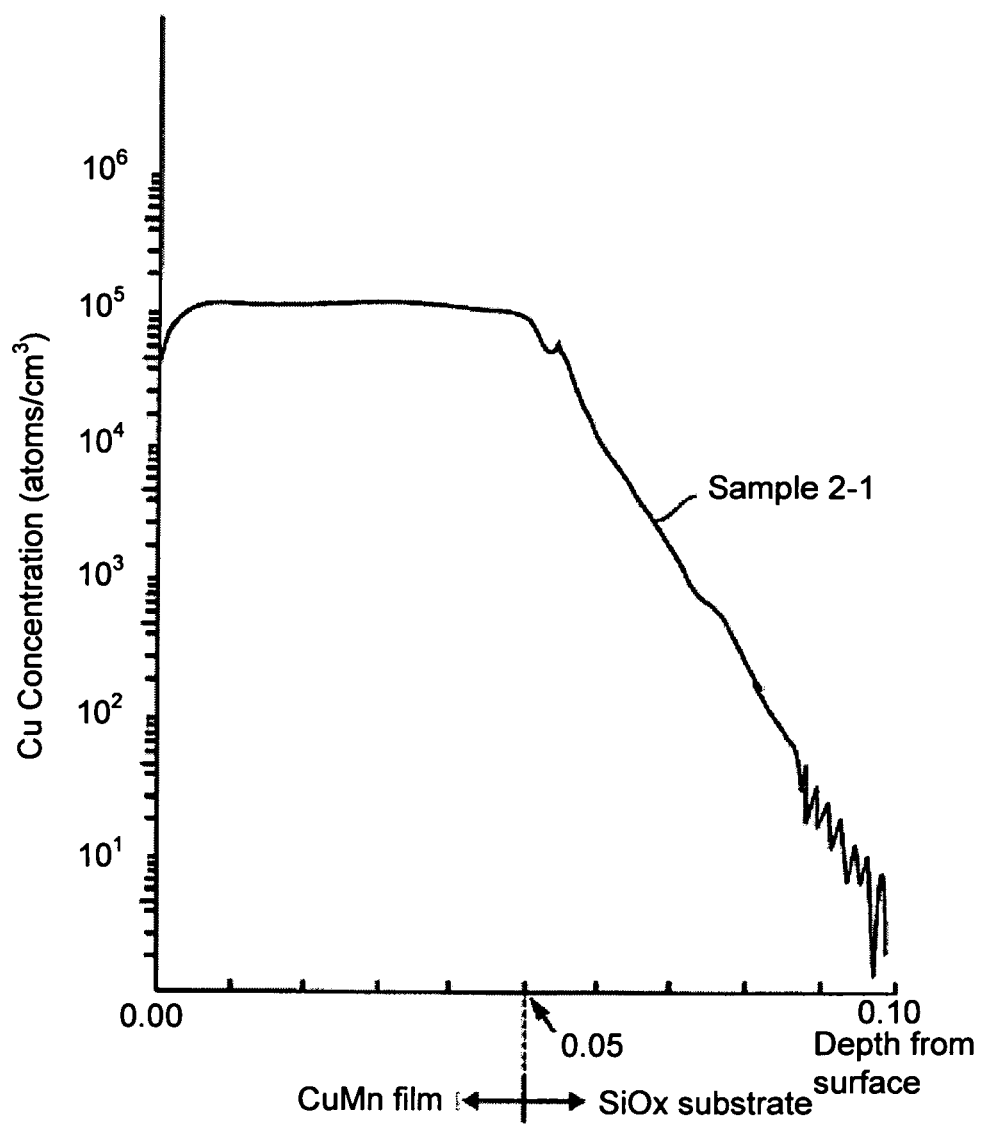
FIG. 20 is a graph showing a measurement result of Cu concentration in a depth direction of each sample by SIMS.

Further, FIGS. 19 and 20 show measurement results of O and Cu concentrates for the sample 2-1 by IMS. The vertical axis of the graph indicates the O and Cu concentrations, and the horizontal axis of the graph indicates the depth from the surface of CuMn film. Each sample 2-2 to 2-5 shows the same result as the sample 2-1 in a range of the depth from the surface 0 to 0.05 µm, thus they are omitted from the graph to avoid complicating the graph.

Based on the measurement result on the Cu and Mn, it is confirmed that due to the change in the Mn contents, the CuMn film having different Mn concentration can be obtained from an identical target without affecting the Cu contents in the film to be formed by changing the process conditions. Further, the Cu in the CuMn film is oxidized as the O contents increases, thereby the resistance of the CuMn film is increased; however, there is little difference in the O concentrations between each sample as shown in the result of this evaluation exam 2-3. Based on this, it is confirmed that the deviation in the resistance between each sample shown in the evaluation exam 2-1 results from the change in the Mn concentrations in the films between the samples, not from the oxidation of the Cu in the film.

What is claimed is:

1. A sputtering method for forming a film for manufacturing a semiconductor device, comprising the steps of:
   transferring a process object into a single treatment vessel having a metal target comprising an alloy containing an additive metal and a main metal, the process object having a lower wiring exposed to an inside of the single treatment vessel and made of a metallic element same as the main metal;
   a first film forming process comprising the steps of supplying a gas configured to generate a plasma in the treatment vessel, plasmarizing the gas by supplying an electric power, and forming a first alloy film on the process object by depositing a plurality of particles of the metal target sputtered with the plasma; and
   a second film forming process comprising the steps of generating a plasma by changing at least one of a pressure in the single treatment vessel and an electric power so that at least one of the pressure in the single treatment vessel and the electric power is different from a pressure in the single treatment vessel in the first film forming process and the electric power used in the first film forming process, and forming a second alloy film, in which a concentration of the additive metal is lower than a concentration of the additive metal of the first alloy film, onto the first alloy film by the particles of the metal target sputtered by the plasma,
   wherein the first film forming process and the second film forming process are performed sequentially in the single treatment vessel.

2. The sputtering method according to claim 1, wherein the first film forming process and the second film forming process are performed by applying a bias voltage for drawing an ion contained in the plasma into the metal target, and
   the second film forming process changes the bias voltage so that the bias voltage in the second film forming process is different from the bias voltage in the first film forming process.

3. The sputtering method according to claim 2, wherein the bias voltage is a negative direct current power in a range of approximately 1 kW to 20 kW.

4. The sputtering method according to claim 1, wherein the electric power is an electric power supplied from a high-frequency power source in a range of approximately 0.1 kW to 6 kW.

5. The sputtering method according to claim 1, wherein the pressure inside the treatment vessel is in a range of approximately 0.133 Pa to $1.33 \times 10^3$ Pa.

6. The sputtering method according to claim 1, wherein the main metal is a copper, and the additive metal is a manganese.

* * * * *